United States Patent [19]

Tsuji et al.

[11] Patent Number: 5,672,550
[45] Date of Patent: Sep. 30, 1997

[54] METHOD OF ENCAPSULATING SEMICONDUCTOR DEVICES USING A LEAD FRAME WITH RESIN TABLETS ARRANGED ON LEAD FRAME

[75] Inventors: Masahiro Tsuji; Osamu Miyata, both of Kyoto, Japan

[73] Assignee: Rohm Co., Ltd., Kyoto, Japan

[21] Appl. No.: 584,449

[22] Filed: Jan. 10, 1996

[30] Foreign Application Priority Data

Jan. 10, 1995 [JP] Japan .................................... 7-018733
Feb. 16, 1995 [JP] Japan .................................... 7-053588

[51] Int. Cl.⁶ .................................................. H01L 21/60
[52] U.S. Cl. .......................... 437/219; 437/211; 437/216; 437/217; 437/220; 264/272.17
[58] Field of Search .......................... 437/211, 215–217, 437/219, 220; 264/272.17

[56] References Cited

U.S. PATENT DOCUMENTS

| | | | |
|---|---|---|---|
| 4,554,126 | 11/1985 | Sera | 264/272.17 |
| 5,275,546 | 1/1994 | Fierkens | 264/272.17 |
| 5,326,243 | 7/1994 | Fierkens | 264/272.17 |
| 5,435,953 | 7/1995 | Osada et al. | 264/272.17 |

FOREIGN PATENT DOCUMENTS

| | | | |
|---|---|---|---|
| 57-8138 | 1/1982 | Japan | 264/272.17 |
| 58-165334 | 9/1983 | Japan | 437/211 |
| 2186647 | 7/1990 | Japan | 264/272.17 |
| 2205043 | 8/1990 | Japan | 264/272.17 |

*Primary Examiner*—John Niebling
*Assistant Examiner*—Kevin Turner
*Attorney, Agent, or Firm*—Brumbaugh, Graves, Donohue & Raymond

[57] ABSTRACT

A method of manufacturing semiconductor devices in which a multi-series lead frame that is constructed so as to assemble semiconductor elements in a state that these elements are arrayed in a plurality of series along the longer sides of the lead frame, is set in a mold, and molding resin is injected into cavities of the mold, to thereby form packages for packing the semiconductor elements in a sealing manner. In the method, a resin tablet is positioned so that resin paths are extended at substantially equal lengths to the cavities on the lead frame set in the mold, and the molding resin is injected into the cavities disposed around the resin tablet by pressing the resin tablet with a plunger.

10 Claims, 6 Drawing Sheets

METHOD OF ENCAPSULATING SEMICONDUCTOR DEVICES USING A LEAD FRAME WITH RESIN TABLETS ARRANGED ON LEAD FRAME

BACKGROUND OF THE INVENTION

1. Field of the Invention

The present invention relates to a method of manufacturing semiconductor devices. More particularly, the invention relates to a technique for sealing semiconductor elements with resin by using a lead frame of the type in which a plurality of series consisting of semiconductor elements are arrayed along the longer sides of the lead frame (this type of the lead frame is referred to as a multi-series lead frame).

2. Discussion of the Related Art

The structure of a conventional multi-series lead frame will be described with reference to FIG. 8.

In the figure, a lead frame 1 is used for assembling so-called quad flat packages (QFPs) in which lead terminals are derived from the four sides of each rectangular package. As shown, frame units 2 each corresponding to one semiconductor device are arrayed in two lines or series in the longitudinal direction of the lead frame 1, viz., along the longer sides of the lead frame 1. Each of the frame units 2 includes a die pad 3 to which a semiconductor element is fastened, located at the central part thereof, and a number of lead terminals 4 disposed around the die pad 3. In FIG. 8, the internal structure of only one frame unit is typically illustrated, for simplicity.

Incidentally, as well known, a molding method, called a low-pressure transfer molding method, is used for sealing semiconductor elements with epoxy resin, for example. Recently, a called multi-plunger method is widely used since it can effectively use resin and has a good moldability. In the multi-plunger method, a lead frame is set in a mold, and the mold includes a plurality of pots for receiving molding resin. Then, resin tablets are put into the pots. In this state, the resin tablets are pressed with plungers, which are independently driven, so that the molding resin is injected into the cavities in the mold. For the molding process using the multi-plunger method, the following two methods are known for sealing the semiconductor elements arrayed in the multi-series lead frame, with resin.

(First conventional method)

The first conventional resin molding method will be described with reference to FIG. 9.

Figure 9:
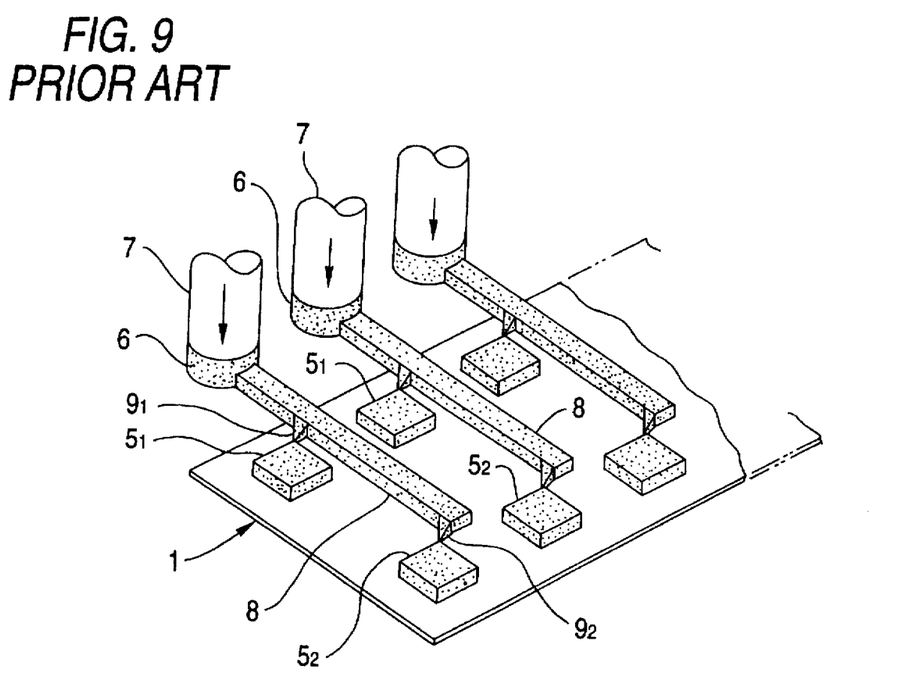
FIG. 9 is a perspective view showing a part of a semiconductor device manufacturing apparatus, which is useful in explaining a first conventional resin molding method.

FIG. 9 is a perspective view useful in explaining the first conventional resin molding method. In the figure, a mold is not illustrated for simplicity.

In the figure, a lead frame 1 designates a multi-series lead frame as already referred to. As shown, two series of semiconductor elements are arrayed along the longer sides of the lead frame 1. In FIG. 9, the semiconductor elements are contained in resin-molded packages $5_1$ and $5_2$, respectively. The packages $5_1$ and $5_2$ correspond to the cavities in the mold, respectively. In a state that the lead frame 1 is set in the mold, a plurality of resin tablets 6 are disposed along and outside the longer side of the lead frame 1 (More exactly, the resin tablets 6 are put into the pots of the mold, respectively). The resin tablets 6 are pressed with plungers 7, which are independently driven. Heated and molten resin, when pressed with the plungers 7, flows through runners (resin paths) 8 of the mold, and enters the related cavities by way of gates (resin injection ports) $9_1$ and $9_2$, which are branched from the runners 8. In this way, the packages $5_1$ and $5_2$ are formed.

(Second conventional method)

The second conventional resin molding method will be described with reference to FIG. 10.

Figure 10:
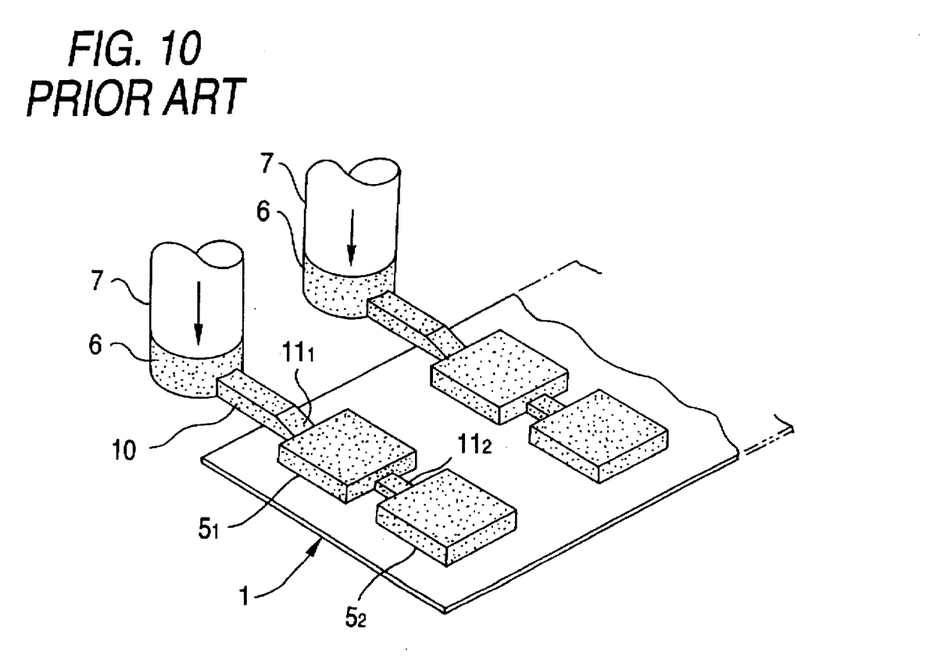
FIG. 10 is a perspective view showing a part of another semiconductor manufacturing apparatus, which is useful in explaining a second conventional resin molding method.

FIG. 10 is a perspective view useful in explaining the second conventional resin molding method. In the figure, a mold is not illustrated for simplicity.

As in the first conventional resin molding method, a plurality of resin tablets 6 are disposed along and outside the longer side of the multi-series lead frame 1. The resin tablets 6 are pressed with plungers 7, respectively. Heated and molten resin, when pressed with the plungers 7, flows through runners 10 of the mold, and enters related first cavities of the package $5_1$ by way of gates $11_1$, which are connected to the runners 10. Subsequently, the molten resin flows into related second cavities of packages $5_2$ by way of through-gates $11_2$, which connects the related first and the second cavities. In this way, the packages $5_1$ and $5_2$ are formed.

Those conventional resin molding methods have the following problem.

The distance from the resin tablet 6, which has been put into the mold, to the cavity of the package $5_1$ is greatly different from the distance from the same resin tablet to the cavity of the package $5_2$. Accordingly, the molten resin reaches the cavities corresponding to the packages $5_1$ and $5_2$ at greatly different times. When the resin reaches the cavity, which is located apart from the resin tablet, the thermal hardening of the resin greatly progresses and the viscosity thereof is increased. This causes some problems. For example, the adhesion properties of the resin to the lead frame is lowered. The resin of high viscosity presses thin metal wires that connect the semiconductor element to the inner leads, so that the metal wires are deformed.

SUMMARY OF THE INVENTION

For the above background reasons, the present invention has an object to provide a method of manufacturing semiconductor devices which is capable of uniformly injecting resin into the cavities of a mold during the process of sealing, with resin, semiconductor devices using the multi-series lead frame.

In order to attain the above object, a first aspect of the invention provides a method of manufacturing semiconductor devices comprising the steps of: setting in a mold a lead frame having a construction in which semiconductor elements are arrayed in a plurality of series in a longitudinal direction of the lead frame; positioning a resin tablet on the lead frame set in the mold so that resin paths are extended from the resin tablet at substantially equal lengths to a plurality of cavities in the mold; and injecting molding resin into the cavities through the resin paths to pack the semiconductor elements by pressing the resin tablet.

Further, a second aspect of the invention provides a method of manufacturing semiconductor devices comprising the steps of: setting in a mold a lead frame in which frame units each including a die pad to which a semiconductor element is fastened and a plurality of lead terminals disposed around the die pad are arranged in a plurality of series; positioning a resin tablet, on the lead frame set in the mold, at an area of a through-hole formed at a position where resin paths are extended from the resin tablet at substantially equal lengths to a plurality of cavities in the mold; and injecting molding resin into the cavities through the resin paths to pack the frame units by pressing the resin tablet.

Furthermore, a third aspect of the invention provides a semiconductor device lead frame comprising: frame units arrayed in a plurality of series, each of the frame units including a die pad to which a semiconductor element is fastened and a plurality of lead terminals disposed around the die pad; and a through-hole formed between adjacent series of the frame units.

DETAILED DESCRIPTION OF THE PREFERRED EMBODIMENTS

Hereinafter, an embodiment of the present invention will be described with reference to the accompanying drawings.

Figure 1:
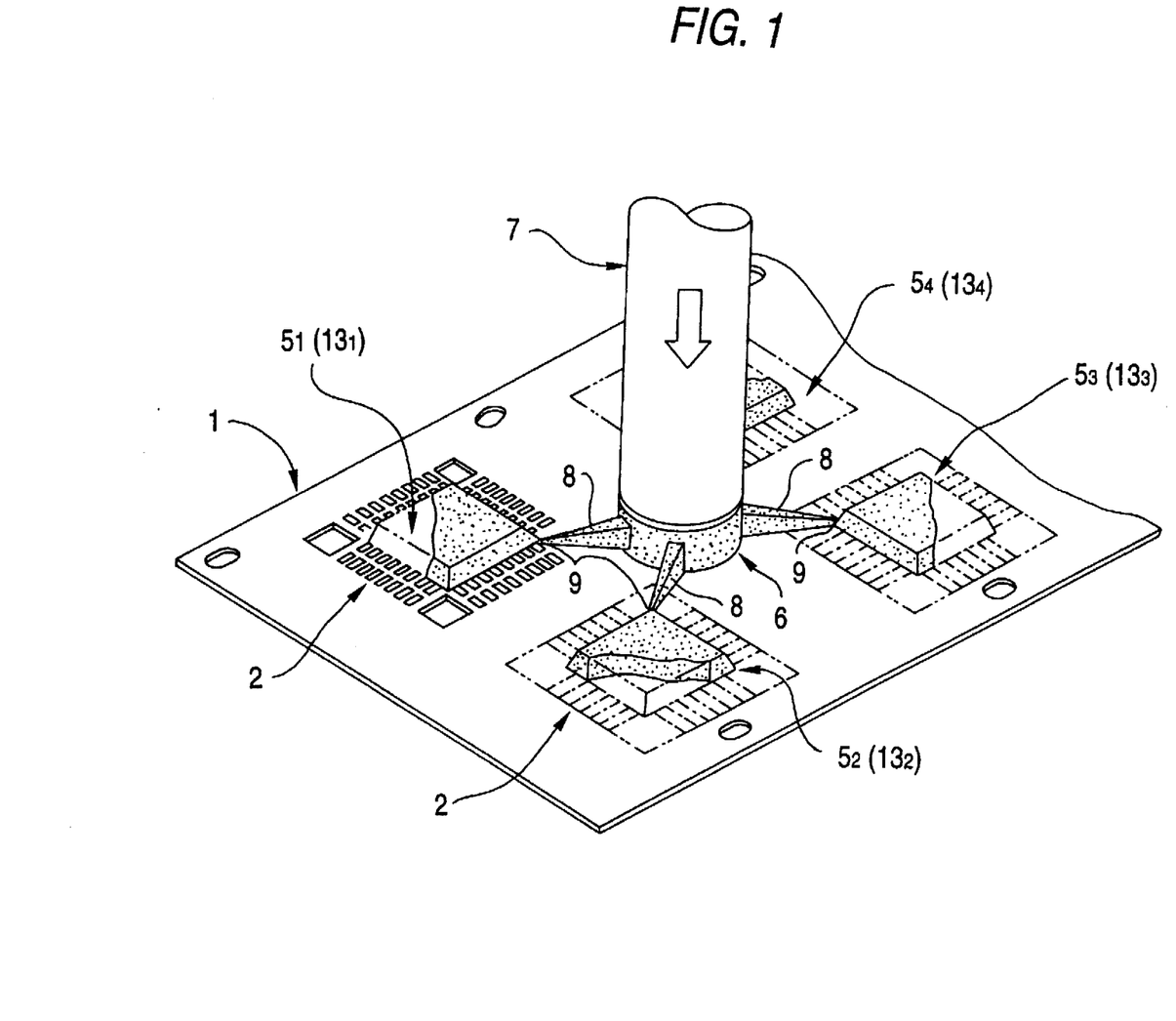
FIG. 1 is a perspective view showing a part of a semiconductor device manufacturing apparatus, which is useful in explaining an embodiment of a semiconductor device manufacturing method according to the invention.
Figure 2:
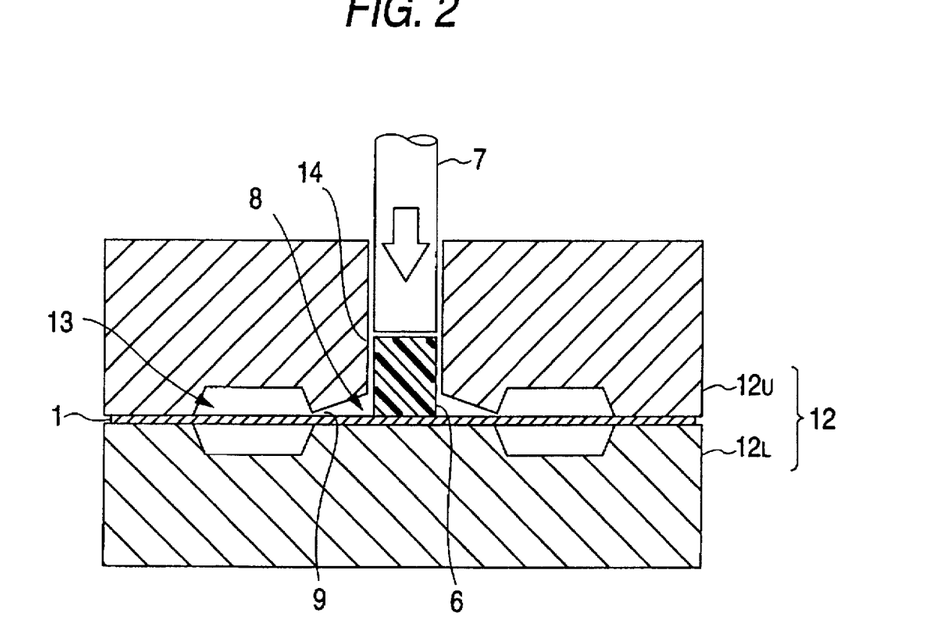
FIG. 2 is a cross sectional view of the semiconductor device manufacturing apparatus shown in FIG. 1.

FIG. 1 is a perspective view showing a part of a semiconductor device manufacturing apparatus for executing a semiconductor device manufacturing method according to the present invention. FIG. 2 is a cross sectional view showing the apparatus. In FIG. 1, a mold is not illustrated for simplicity of illustration.

Figure 8:
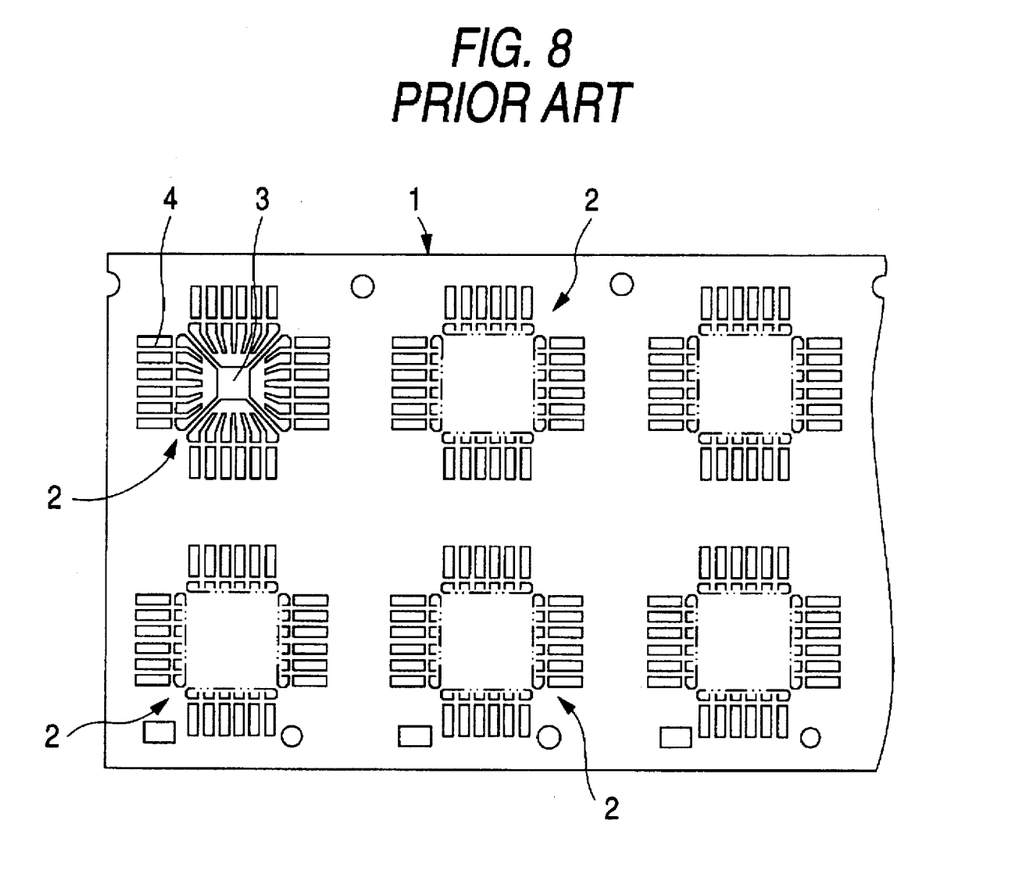
FIG. 8 is a partial plan view showing a conventional multi-series lead frame.

A lead frame 1 is a multi-series lead frame of the same type as that shown in FIG. 8. A semiconductor element is packed in each of packages 5 ($5_1$, $5_2$, $5_3$, $5_4$, ...) in a state that it is connected to a number of inner leads by means of thin metal wires.

As shown in FIG. 2, the lead frame 1 is set between an upper mold $12_U$ and a lower mold $12_L$ of a mold 12. Cavities 13 defined by the upper and the lower molds $12_U$ and $12_L$ are filled with resin, thereby forming packages 5. The upper mold $12_U$ includes a hole (pot) 14 formed therein, into which a resin tablet 6 is put. The pot 14, viz., the resin tablet 6, is positioned so that runners (resin paths) 8 are extended at substantially equal lengths to cavities $13_1$ to $13_4$, which correspond to the four packages $5_1$ to $5_4$, on the lead frame 1. The runners 8 are radially extended from the pot 14 of the upper mold $12_U$ to the corners of the cavities $13_1$ to $13_4$, through gates 9. In the present embodiment, the gates 9 are communicatively connected to the cavities 13 of the upper mold $12_U$, respectively. Alternatively, the runners 8 may be guided to the rear side of the lead frame 1, and the gates 9 may be communicatively connected to the cavities 11 of the lower mold $12_L$. When the semiconductor elements are assembled into the upper surface of the lead frame 1 in a state shown in FIG. 2, it is preferable to provide the gates 9 on the lower mold $12_L$ as in the alternative. The reason for this is that if so done, injected resin will never come in contact with the semiconductor elements and the thin metal wires.

In the apparatus thus constructed, the resin tablet 6 is put into the pot 14 of the mold 12 heated to a predetermined temperature, and then a plunger 7 is moved down to press the resin tablet 6. The molten resin, when pressed with the plunger 7, radially flows through the runners 8 and is equally injected into the cavities $13_1$ to $13_4$.

Figure 3:
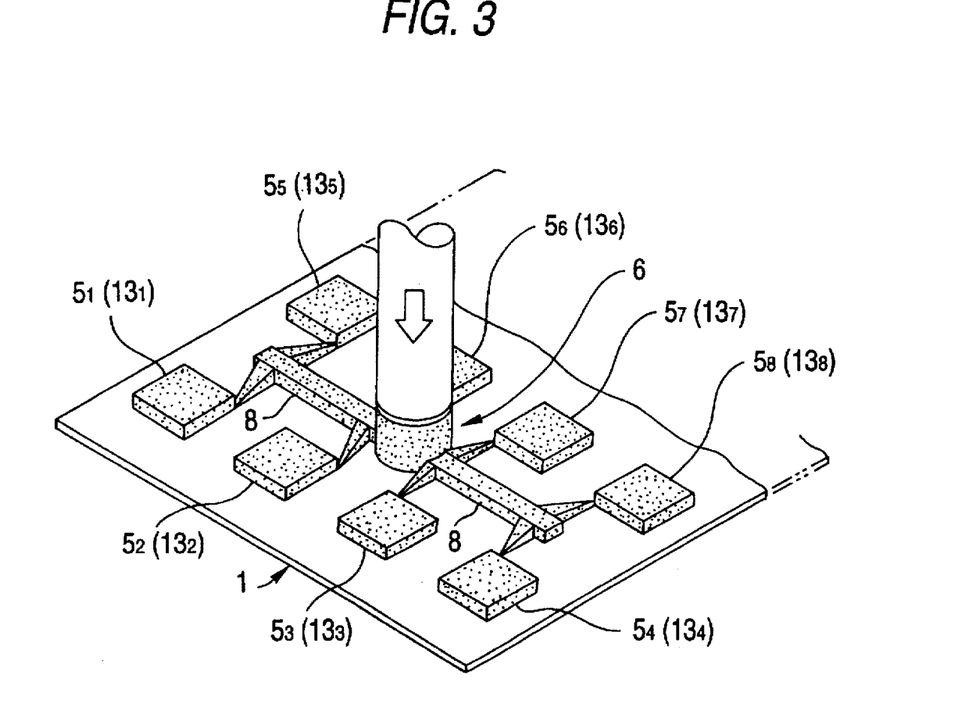
FIG. 3 is a perspective view showing a part of another semiconductor device manufacturing apparatus, which is useful in explaining another embodiment of the semiconductor device manufacturing method according to the invention.

In the above-mentioned embodiment, the invention is applied to the multi-series lead frame that is constructed so as to assemble semiconductor elements in a state that these elements are arrayed in two lines along the longer sides of the lead frame. Alternatively, the invention is applicable to a multi-series lead frame 1 that is constructed so as to assemble semiconductor elements in a state that these elements are arrayed in four lines along the longer sides of the lead frame. In the alternative, molding resin is substantially equally injected into cavities $13_1$ to $13_8$, which correspond to eight packages $5_1$ to $5_8$ located around a resin tablet 6 on the lead frame 1. The molding resin is injected into a group of the cavities $13_2$, $13_3$, $13_6$, and $13_7$ located near the resin tablet 6, and the remaining cavities $13_1$, $13_4$, $13_5$, and $13_8$, not simultaneously. However, the difference of the lengths of the runners 8 extended to the cavities is smaller than that in the conventional apparatus in which the resin tablets are located outside the lead frame. Accordingly, the resin injection conditions (viscosity of the resin, for example) may be made equal.

As seen from the foregoing description, in the invention, a resin tablet is positioned on the lead frame set in the mold so that the resin paths are extended at substantially equal lengths to a plurality of cavities. Molding resin is injected into the cavities around the resin tablet. With such a construction, the resin reaches the cavities at substantially the same time, so that the resin can be injected into the cavities under substantially the same conditions. Accordingly, the invention is free from such an unwanted phenomenon that the viscosity of the molding resin injected into the cavities located apart from the resin tablet is increased. In this respect, the invention succeeds in solving the problems resulting from the viscosity increase, viz., deteriorated adhesion properties of the resin to the lead frame and the deformation of thin metal wires.

Further, it is noted that the resin paths from the resin tablet to the cavities are reduced in length. This fact implies that it is allowed to use the resin of the type which is hardened in a short time, and the production efficiency is improved so much. Additionally, the efficiency of using the molding resin is improved because the resin paths are short.

Figure 4:
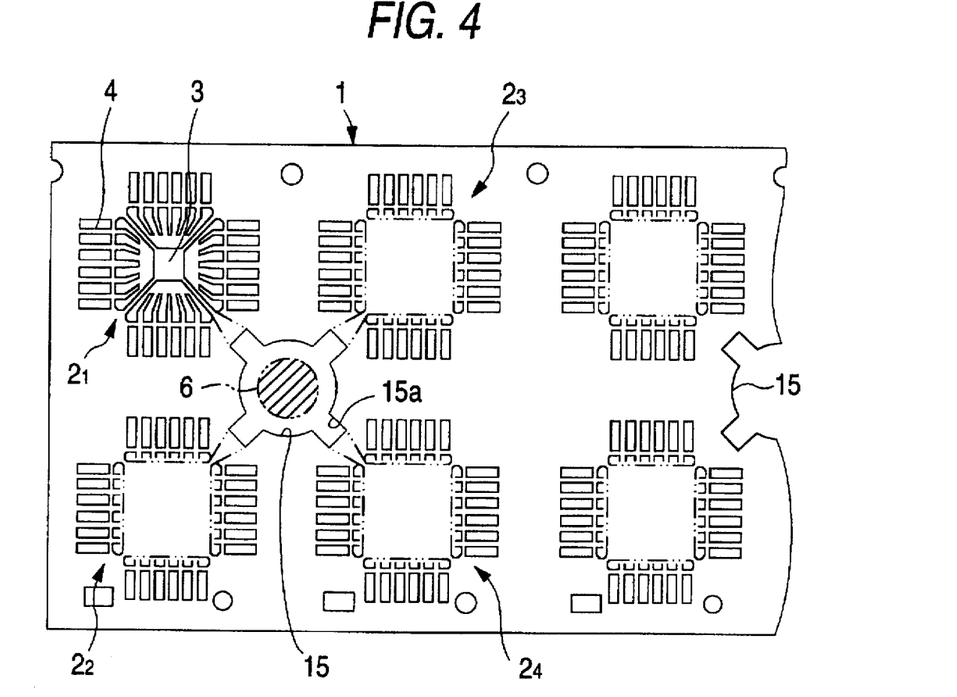
FIG. 4 is a partial plan view showing an embodiment of a semiconductor device lead frame according to the invention.

FIG. 4 is a partial plan view showing an embodiment of a lead frame for semiconductor devices according to the present invention.

In the figure, a lead frame 1 is used for assembling quad flat packages (QFPs), as in the conventional multi-series lead frame shown in FIG. 8. As shown, frame units 2 ($2_1$, $2_2$, ...) are arrayed in two lines or series in the longitudinal direction of the lead frame 1, viz., along the longer sides of the lead frame 1. Each of the frame units 2 includes a die pad 3 to which a semiconductor element is fastened, located at the central part thereof, and a number of lead terminals 4 disposed around the die pad 3. The lead frame 1 is formed from a thin metal strip by the punching work or etching process. The thin metal strip is approximately 0.1 to 0.25 mm thick, and made of iron-nickel alloy or copper alloy.

A through-hole 15 is formed at a position between the series of frame units 2 that are extended in the longitudinal direction of the lead frame 1, and preferably which is equally distanced from the four frame units $2_1$ to $2_4$. The lead frame 1 includes a number of combinations each consisting of the four frame units $2_1$ to $2_4$ and the through-hole 15. The position of each through-hole 15 is coincident with a position (indicated by slanted lines in FIG. 4) where a resin tablet 6 is disposed when the packages are sealed with resin by a resin molding process. The diameter of the through-hole 15 is larger than that of the resin tablet.

Figure 5:
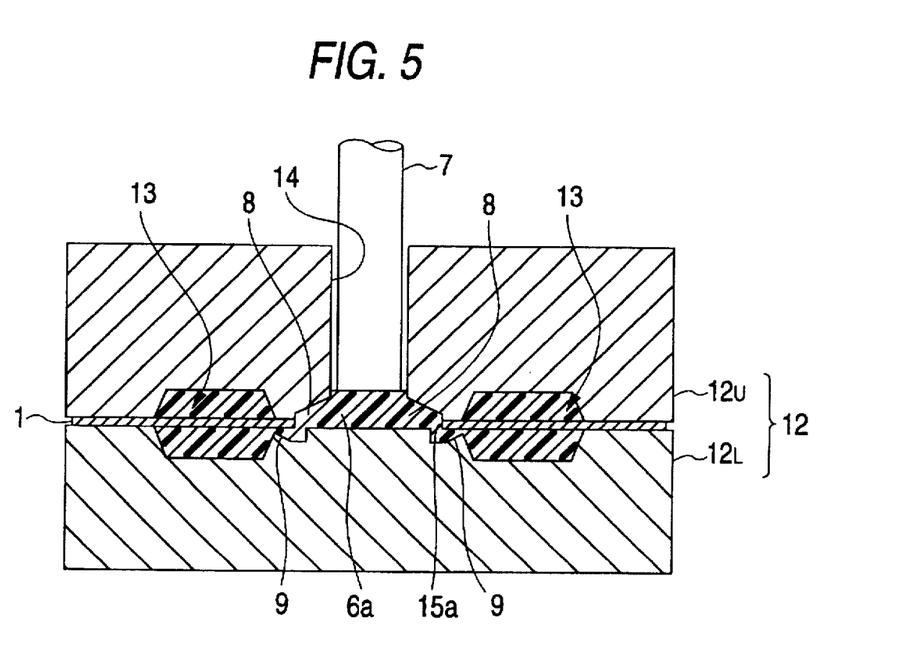
FIG. 5 is a cross sectional view showing a part of a semiconductor device manufacturing apparatus for explaining an embodiment of a semiconductor device manufacturing method (molding process) according to the invention.

Cutout portions 15a are radially extended from the circumferential edge of the through-hole 15 toward the frame units $2_1$ to $2_4$. As shown in FIG. 5, gates 9, which are used for introducing resin into cavities 13 of a lower mold $12_L$ of the mold in a molding process, are formed in the lower mold $12_L$. Because of this, runners 8 must be extended from an upper mold $12_U$ to the lower mold $12_L$, through the lead frame 1. It is for this reason that the cutout portions 15a are provided. Therefore, there is no need of forming the cutout portions 15a when the gates are formed in the upper mold $12_U$ as shown in FIG. 2.

A resin molding process for sealing semiconductor devices with resin when the lead frame thus constructed is used will be described with reference to FIGS. 4 and 5.

As shown in FIG. 5, the lead frame 1 having semiconductor elements mounted on the frame units 2 is set in the mold 12. The resin tablet 6 is put into the pot 14 of the mold. The resin tablet 6 put into the pot 14 is automatically disposed at the area (the inner part of the through-hole 15 in this instance) of the through-hole 15 of the lead frame 1 (FIG. 4). The resin tablet 6 is pressed with a plunger 7 of the molding apparatus. Then, molten resin is injected into the cavities 13, through the runners 8 and the gates 9 of the lower mold $12_L$. As a result, the portions including the semiconductor elements and the thin metal wires on the frame units 2, which are disposed within the cavities 13, are sealed with the resin. The resin is injected from the lower mold $12_L$ in order to prevent the thin metal wires, which are connected to the semiconductor elements mounted on the upper surface of the lead frame 1, from directly contacting with the injected resin. If those wires come in contact with the resin, the wires are bent possibly. If the bending of the metal wires is not problematic, the gates 9 may be formed in the upper mold $12_U$ of the mold, as a matter of course.

Simultaneously with the injection of the resin into the cavities 13, the through-hole 15 of the lead frame 1 is filled with the resin. Accordingly, the resin is spread on the inner wall of the through-hole 15, so that the adhesion therebetween is increased. Consequently, when the resin is thermally hardened and the plunger 7 is lifted, a cull 6a does not stick to the bottom face of the plunger 7.

Figure 6:
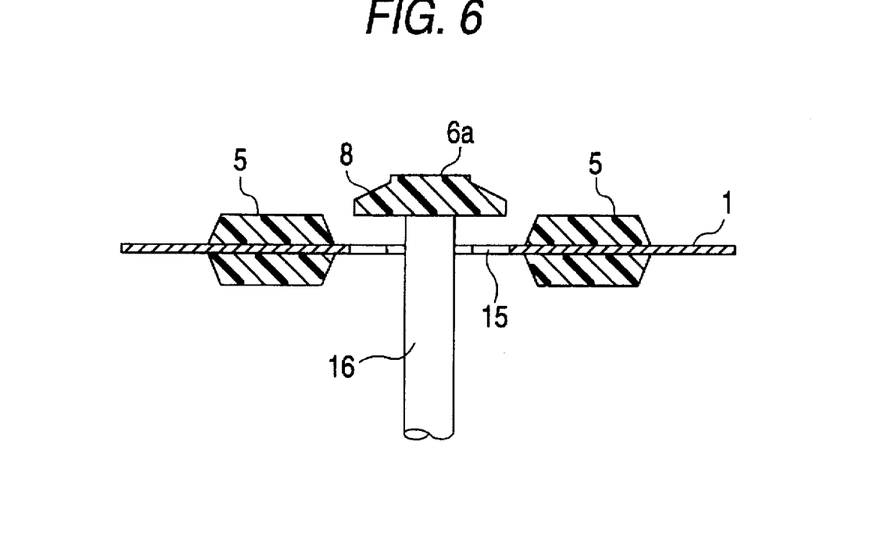
FIG. 6 is a cross sectional view for explaining a cull removal process in the embodiment of the semiconductor device manufacturing method according to the invention.

A process to remove the cull, which follows the resin molding process, will be described with reference to FIG. 6.

The lead frame 1 with the packages 5 formed thereon is transported to the next cull-removal process, in a state that the cull 6a is stuck onto the surface of the lead frame. In this process, as shown in FIG. 6, to remove the cull 6a from the lead frame 1, the cull 6a is pushed up with a punch 16 through the through-hole 15 from the side (the lower side of the lead frame 1 in FIG. 6) of the lead frame 1 that is opposite to the side thereof on which the resin tablet 6 is put.

The embodiment of the invention may be modified as follows.

Figure 7:
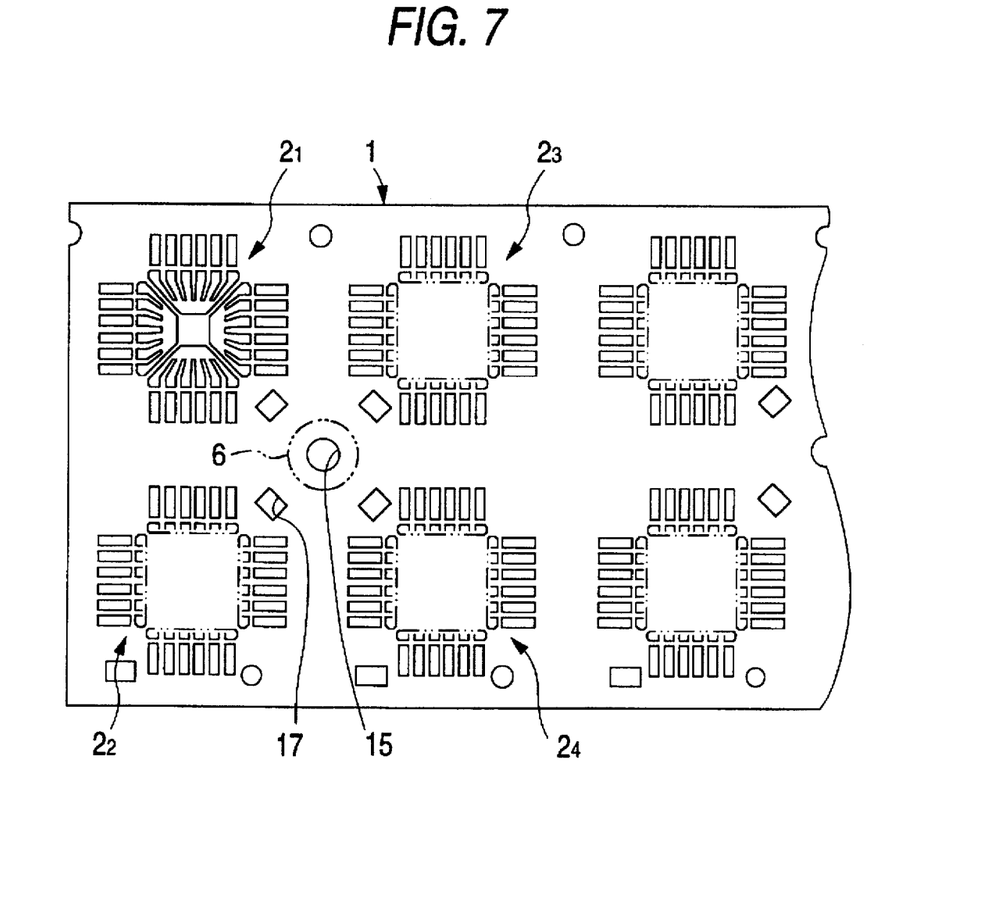
FIG. 7 is a partial plan view showing another embodiment of the semiconductor device lead frame according to the invention.

(1) In a modification of the above-mentioned embodiment of the invention shown in FIG. 7, a through-hole 15, smaller in diameter than a resin tablet 6 (indicated by a two-dot chain line in FIG. 7), is formed in the lead frame 1. Four small square holes 17 are formed around the through-hole 15. The small holes 17 are used for guiding the runners formed in the upper mold to the gates formed in the lower mold.

(2) While in the above-mentioned embodiment, two series of the frame units 2 are arrayed on the lead frame 1, it is evident that the invention is applicable to a lead frame with three or more series of frame units.

(3) Where the runners 8 are relatively long and uniformly disposed on the lead frame 1, other through-holes may be formed at proper locations on the lead frame 1 where the runners 8 are formed. As described referring to FIG. 6, the runners 8 may be removed by pushing up each runner with a punch.

(4) While the invention is applied to the lead frame for assembling the QFPs in the above-mentioned embodiment, the invention is applicable to any other lead frame for semiconductor packages on which frame units are arrayed in a multiple of series.

As seen from the foregoing description, the invention has the following beneficial effects.

In the invention, during the molding process, the molten resin flows into the through-holes of the lead frame, so that the adhesion of the resin left (cull) to the lead frame is increased. Therefore, after the molding process is completed, the plunger is lifted while having no cull sticking to the bottom face thereof.

Further, after the necessary portions of each frame unit of the lead frame are sealed with the molding resin, the cull may easily be removed from the lead frame by pushing the cull with a punch through the through-hole of the lead frame, from the second side of the lead frame that is opposite to the first side thereof on which the resin tablet is put.

What is claimed is:

1. A method of manufacturing semiconductor devices comprising the steps of:

setting in a mold a lead frame having a construction in which semiconductor elements are arrayed in a plurality of series in a longitudinal direction of the lead frame;

positioning a resin tablet on the lead frame set in the mold so that resin paths are extended from the resin tablet at substantially equal lengths to a plurality of cavities in the mold; and injecting molding resin into the cavities through the resin paths to pack the semiconductor elements by pressing the resin tablet.

2. The method of manufacturing semiconductor devices according to claim 1, wherein said positioning step of the resin tablet is performed by putting the resin tablet into a pot provided in the mold.

3. The method of manufacturing semiconductor devices according to claim 2, wherein said injecting step of the molding resin is performed through the resin paths radially extended from the pot.

4. The method of manufacturing semiconductor devices according to claim 1, wherein said injecting step of the molding resin is performed by pressing the resin tablet with a plunger.

5. A method of manufacturing semiconductor devices comprising the steps of:

setting in a mold a lead frame in which frame units each including a die pad to which a semiconductor element is fastened and a plurality of lead terminals disposed around the die pad are arranged in a plurality of series;

positioning a resin tablet, on the lead frame set in the mold, at an area of a through-hole formed at a position where resin paths are extended from the resin tablet at substantially equal lengths to a plurality of cavities in the mold; and injecting molding resin into the cavities through the resin paths to pack the frame units by pressing the resin tablet.

6. The method of manufacturing semiconductor devices according to claim 5, wherein in said positioning step of the resin tablet, said resin tablet is positioned at the area of the through-hole larger in diameter than said tablet.

7. The method of manufacturing semiconductor devices according to claim 6, wherein in said positioning step of the resin tablet, said resin tablet is positioned at the area of the through-hole having cutout portions formed at a circumferential edge thereof, said cutout portions corresponding to the cavities.

8. The method of manufacturing semiconductor devices according to claim 5, wherein in said positioning step of the resin tablet, said resin tablet is positioned at the area of the through-hole smaller in diameter than said tablet.

9. The method of manufacturing semiconductor devices according to claim 8, wherein in said positioning step of the resin tablet, said resin tablet is positioned at the area of the through-hole having small holes formed around the through-hole, said small holes corresponding to the cavities.

10. The method of manufacturing semiconductor devices according to claim 5, wherein after said injecting step of the molding resin into the cavities, an extra resin portion left on a first side of the lead frame is removed from the lead frame by pushing up the extra resin portion with a punch, through the through-hole of the lead frame, from a second side of the lead frame opposite to the first side thereof on which the resin tablet is put.

* * * * *